United States Patent
Lee et al.

(10) Patent No.: US 10,770,546 B2
(45) Date of Patent: Sep. 8, 2020

(54) HIGH DENSITY NANOTUBES AND NANOTUBE DEVICES

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 16/142,565

(22) Filed: Sep. 26, 2018

(65) Prior Publication Data

US 2020/0098861 A1    Mar. 26, 2020

(51) Int. Cl.
*H01L 21/00* (2006.01)
*H01L 29/06* (2006.01)
(Continued)

(52) U.S. Cl.
CPC ...... *H01L 29/0676* (2013.01); *H01L 21/0228* (2013.01); *H01L 21/02112* (2013.01); *H01L 21/02164* (2013.01); *H01L 21/02236* (2013.01); *H01L 21/02255* (2013.01); *H01L 21/02532* (2013.01); *H01L 21/02606* (2013.01); *H01L 21/02617* (2013.01); *H01L 21/31116* (2013.01); *H01L 21/31144* (2013.01); *H01L 21/76224* (2013.01); *H01L 21/823425* (2013.01); *H01L 21/823481* (2013.01); *H01L 21/823487* (2013.01); *H01L 27/088* (2013.01);
(Continued)

(58) Field of Classification Search
CPC .......... H01L 29/0676; H01L 21/02112; H01L 21/02164
See application file for complete search history.

(56) References Cited

U.S. PATENT DOCUMENTS 5,470,801 A * 11/1995 Kapoor ............. H01L 21/31051
438/471
7,858,965 B2 * 12/2010 Lu .......................... B82Y 10/00
257/19
(Continued)

FOREIGN PATENT DOCUMENTS

JP        2010192599 A    9/2010
KR       100880377 B1    1/2009

*Primary Examiner* — Kimberly N Rizkallah
*Assistant Examiner* — Alexander Belousov
(74) *Attorney, Agent, or Firm* — Vazken Alexanian; Ryan, Mason & Lewis, LLP (57) ABSTRACT

A method for manufacturing a semiconductor device includes forming a plurality of pillars on a substrate. Each pillar of the plurality of pillars includes a silicon germanium portion. In the method, a layer of germanium oxide is deposited on the plurality of pillars, and a thermal annealing process is performed to convert outer regions of the silicon germanium portions into a plurality of silicon nanotubes. Each silicon nanotube of the plurality of silicon nanotubes surrounds a silicon germanium core portion. The method also includes exposing top surfaces of each of the silicon germanium core portions, and selectively removing each of the silicon germanium core portions with respect to the plurality of silicon nanotubes to create a plurality of gaps.

17 Claims, 10 Drawing Sheets

(51) Int. Cl.

| | | |
|---|---|---|
| *H01L 27/088* | (2006.01) | |
| *H01L 21/02* | (2006.01) | |
| *H01L 29/08* | (2006.01) | |
| *H01L 21/8234* | (2006.01) | |
| *H01L 29/423* | (2006.01) | |
| *H01L 29/78* | (2006.01) | |
| *H01L 21/762* | (2006.01) | |
| *H01L 29/10* | (2006.01) | |
| *H01L 29/66* | (2006.01) | |
| *H01L 21/311* | (2006.01) | |

(52) U.S. Cl.
CPC ...... *H01L 29/0847* (2013.01); *H01L 29/1037* (2013.01); *H01L 29/42392* (2013.01); *H01L 29/6656* (2013.01); *H01L 29/7827* (2013.01)

(56) References Cited

U.S. PATENT DOCUMENTS

| | | | | |
|---|---|---|---|---|
| 7,977,054 | B2* | 7/2011 | Johnson, Jr. | G01N 33/551 204/403.01 |
| 8,871,576 | B2* | 10/2014 | Tekleab | H01L 29/0676 438/157 |
| 8,901,644 | B2* | 12/2014 | Huang | H01L 29/0657 257/329 |
| 9,224,813 | B2* | 12/2015 | Hussain | H01L 29/0676 |
| 9,506,892 | B2* | 11/2016 | Matsumoto | B82Y 10/00 |
| 9,570,299 | B1* | 2/2017 | Cheng | H01L 21/02694 |
| 9,595,449 | B1* | 3/2017 | Jagannathan | H01L 21/3105 |
| 9,935,189 | B2* | 4/2018 | Cho | H01L 21/02236 |
| 10,559,675 | B2* | 2/2020 | Li | H01L 29/6653 |
| 2005/0051805 | A1* | 3/2005 | Kim | H01L 51/002 257/222 |
| 2008/0191196 | A1* | 8/2008 | Lu | H01L 29/165 257/27 |
| 2008/0285927 | A1* | 11/2008 | Khan | C03B 37/01446 385/123 |
| 2011/0210309 | A1* | 9/2011 | Ben-Ishai | H01L 29/0665 257/9 |
| 2017/0005112 | A1* | 1/2017 | Chang | H01L 21/845 |
| 2019/0198637 | A1* | 6/2019 | Li | H01L 29/6653 |
| 2019/0363175 | A1* | 11/2019 | Li | H01L 29/775 |
| 2020/0098861 | A1* | 3/2020 | Lee | H01L 29/0847 |
| 2020/0111714 | A1* | 4/2020 | Lee | H01L 21/02532 |

* cited by examiner

HIGH DENSITY NANOTUBES AND NANOTUBE DEVICES

TECHNICAL FIELD

The field generally relates to semiconductor devices and methods of manufacturing same and, in particular, to manufacturing nanotubes and nanotube device by forming silicon-rich shells through selective reaction of silicon germanium with germanium oxide.

BACKGROUND

Silicon nanotubes are nanoparticles made of silicon atoms and have a cylindrical tube-like shape. Silicon nanotubes are similar to carbon nanotubes in some respects and have been successfully used in the semiconductor industry in a variety of applications including, for example, as components of transistors and sensors.

However, there is lack of reliable methods to form dense and uniform nanotubes. For example, vertically grown silicon nanotubes have been known in the art, but the uniformity of the grown silicon nanotubes is poor.

Accordingly, there is a need for methods and structures to form uniform and dense arrangements nanotubes at relatively small distances from each other.

SUMMARY

According to an exemplary embodiment of the present invention, a method for manufacturing a semiconductor device includes forming a plurality of pillars on a substrate. Each pillar of the plurality of pillars includes a silicon germanium portion. In the method, a layer of germanium oxide is deposited on the plurality of pillars, and a thermal annealing process is performed to convert outer regions of the silicon germanium portions into a plurality of silicon nanotubes. Each silicon nanotube of the plurality of silicon nanotubes surrounds a silicon germanium core portion. The method also includes exposing top surfaces of each of the silicon germanium core portions, and selectively removing each of the silicon germanium core portions with respect to the plurality of silicon nanotubes to create a plurality of gaps.

According to an exemplary embodiment of the present invention, a semiconductor device includes a plurality of silicon nanotubes disposed on a substrate. Each of the plurality of silicon nanotubes is disposed on a pedestal portion of the substrate, and surrounds a gate structure and/or a dielectric layer on a corresponding pedestal portion. A plurality of source/drain regions extend from upper portions of the plurality of silicon nanotubes.

According to an exemplary embodiment of the present invention, a method for manufacturing a semiconductor device includes forming a plurality of semiconductor layers spaced apart from each other on respective pedestal portions of a substrate. Each semiconductor layer of the plurality of semiconductor layers includes germanium. In the method, a layer of germanium oxide is deposited on the plurality of semiconductor layers, and a thermal annealing process is performed to convert outer regions of the semiconductor layers into a plurality of nanotubes. Each nanotube of the plurality of nanotubes surrounds a semiconductor layer core portion. The method further includes exposing top surfaces of each of the semiconductor layer core portions, and selectively removing each of the semiconductor layer core portions with respect to the plurality of nanotubes to create a plurality of gaps.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to the formation of dense silicon nanotube arrays by selectively reacting silicon germanium with germanium oxide.

It is to be understood that the various layers and/or regions shown in the accompanying drawings are not drawn to scale, and that one or more layers and/or regions of a type commonly used in, for example, nanotube, field-effect transistor (FET), fin field-effect transistor (FinFET), vertical field-effect transistor (VFET), CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, nanotubes, FETs, FinFETs, VFETs, CMOSs, nanowire FETs, nanosheet FETs, SETs, and/or MOSFETs. By way of non-limiting example, the semiconductor devices can include, but are not necessarily limited to nanotube, FET, FinFET, VFET, CMOS, nanowire FET, nanosheet FET, SET, CMOS and MOSFET devices, and/or semiconductor devices that use nanotube, FET, FinFET, VFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for uniform and dense silicon nanotube arrays. Embodiments of the present invention utilize a "germanium pull-out" process in conjunction with other semiconductor fabrication processes to form uniform silicon nanotubes in close proximity to each other. In general, the germanium pull-out process is performed by depositing germanium oxide ($GeO_2$) on silicon germanium (SiGe) regions and performing a high temperature spike anneal process (e.g., >900° C.), which causes GeO desorption from the deposited $GeO_2$, and the silicon in the SiGe to react with oxygen atoms in the $GeO_2$ to form silicon oxide ($SiO_x$), where x is, for example, 2 in the case of silicon dioxide ($SiO_2$), or another value such as 1.99 or 2.01. The germanium pull-out process is limited to SiGe portions due to a reaction of the deposited $GeO_2$ with the SiGe during the high temperature spike anneal process. As a further result of the high temperature spike annealing, a silicon-rich (Si-rich) surface region is formed between the $SiO_x$ and a SiGe core region.

A chemical reaction of $GeO_2$ with SiGe portions causes the formation and desorption of 2GeO ($Ge+GeO_2 \rightarrow 2GeO$), and the formation of $SiO_x$ and a Si-rich top surface on the SiGe portion during spike annealing. The germanium pull-out process is self-limiting, such that selective Ge atom removal continues until the $GeO_2$ is consumed or the number of Si atoms on the top surface of the SiGe portion is enough to block further chemical reaction of $GeO_2$ with germanium from the SiGe portion. Thus, the germanium pull-out process can be a self-limited process controlled by a thickness of a deposited $GeO_2$ layer. The $GeO_2$ does not react with Si surfaces lacking germanium.

Figure 1:
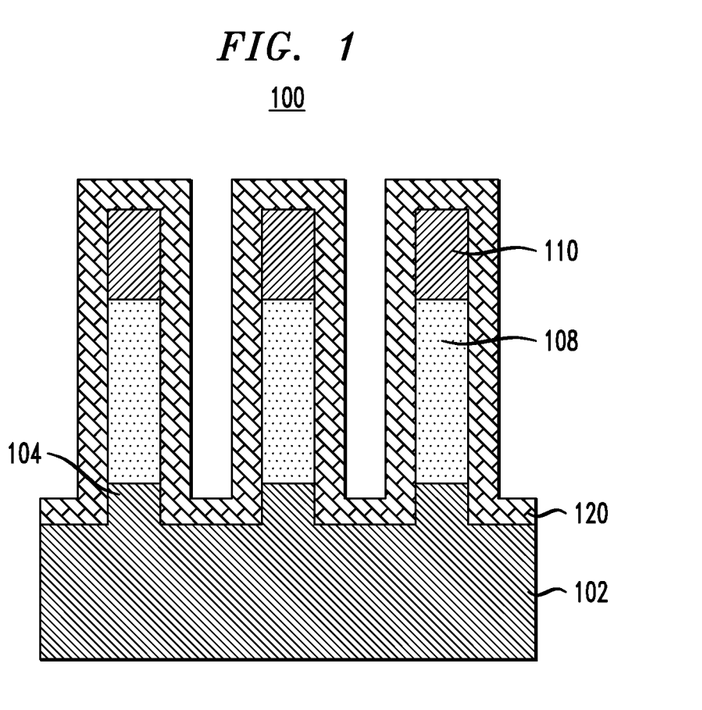
FIG. 1 is a cross-sectional view illustrating semiconductor pillar formation and deposition of germanium oxide in a method of manufacturing a semiconductor device, according to an exemplary embodiment of the present invention.

FIG. 1 is a cross-sectional view illustrating semiconductor pillar formation and deposition of germanium oxide in a method of manufacturing a semiconductor device, according to an exemplary embodiment of the present invention. Referring to FIG. 1, in a device 100, a semiconductor layer comprising SiGe is epitaxially grown on a semiconductor substrate 102, and patterned into pillars including SiGe portions 108. An atomic percentage concentration of germanium in the SiGe can be for example, in a range of about 20% to about 80%.

In accordance with an embodiment of the present invention, the substrate 102 comprises, a semiconductor material including, but not necessarily limited to, silicon (Si), silicon carbide (SiC), Si:C (carbon doped silicon), a II-V or III-V compound semiconductor or other like semiconductor. In addition, multiple layers of the semiconductor materials can be used as the semiconductor material of the substrate 102. In accordance with an embodiment of the present invention, a resulting vertical height (e.g., thickness) of the semiconductor layer from which the SiGe portions 108 are formed is about 10 nm to about 100 nm after epitaxial growth.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The semiconductor layer and an upper portion of the substrate 102 are patterned into a plurality of pillars including patterned stacks of the SiGe portions 108 and upper portions 104 of the substrate 102, which are each under a hardmask layer 110. For ease of explanation, three pillars are shown in FIG. 1. However, the embodiments of the present invention are not necessarily limited thereto, and the patterning can result into more or less than three pillars. According to an embodiment of the present invention, the substrate 102 and the upper portions 104 comprise silicon, but do not comprise germanium.

According to an embodiment, the hardmasks 110 including, for example, a dielectric material, such as silicon nitride (SiN) are formed on the portions of the semiconductor layer that are to be formed into the pillars. The pillar patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hardmask to form the pillars by RIE processes. According to an embodiment of the present invention, the width of the pillars as a result of the patterning is about 5 nm to about 50 nm.

Referring further to FIG. 1, a $GeO_2$ layer 120 is deposited using, for example, atomic layer deposition (ALD) or other conformal deposition process, on the patterned stacks including the SiGe portions 108, upper portions 104 of the substrate 102, and the hardmask layers 110, and on the exposed portions of the substrate 102. In a non-limiting embodiment, a thickness of the $GeO_2$ layer 120 can be in the range of about 3 nm to about 10 nm.

Figure 2:
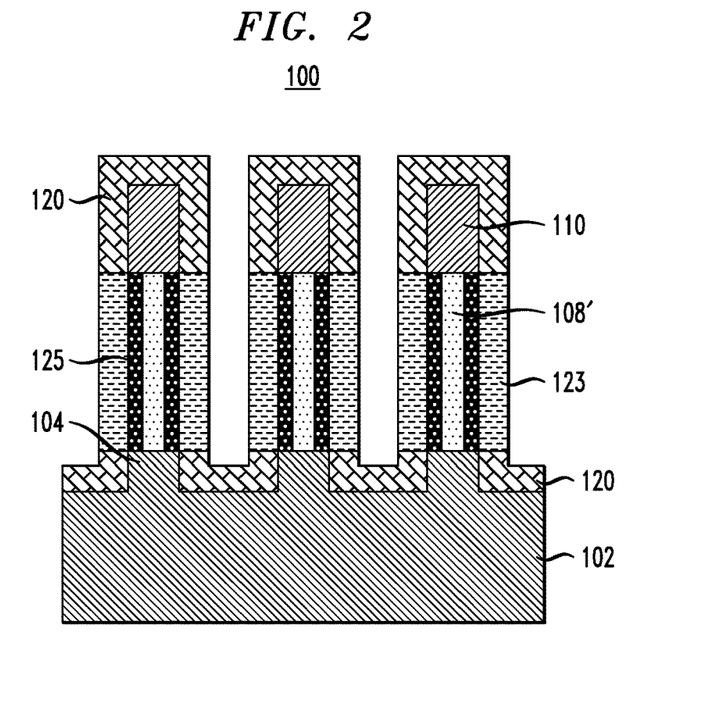
FIG. 2 is a cross-sectional view illustrating formation of silicon-rich layers as a result of a thermal annealing process in a method of manufacturing a semiconductor device, according to an exemplary embodiment of the present invention.

FIG. 2 is a cross-sectional view illustrating formation of silicon-rich layers as a result of a thermal annealing process in a method of manufacturing a semiconductor device, according to an exemplary embodiment of the present invention. Referring to FIG. 2, after deposition of the $GeO_2$ layer 120, a thermal annealing process is performed in, for example, nitrogen (N) or an inert gas ambient, for example, argon (Ar), helium (He), and/or xenon (Xe). In accordance with an embodiment of the present invention, the temperature at which the thermal annealing process is performed is about 800° C. to about 1100° C., depending on the atomic percentage of germanium in the SiGe portions 108. As noted herein above, the thermal annealing is a high temperature spike anneal process during which Ge in the SiGe portions 108 is pulled out by a reaction with the $GeO_2$ 120, resulting in Si-rich layers 125 (also referred to herein as "silicon nanotubes") around remaining SiGe core portions 108', and SiO$_x$ layers 123 replacing the reacted portions of the GeO$_2$ on the Si-rich layers 125. There is no reaction between the GeO$_2$ 120 and the hardmasks 110 including, for example, SiN, or between the GeO$_2$ 120 and pedestal portions 104 or the top surface of the substrate 102, which include, for example, silicon. As a result, the upper pedestal portions 104 of the substrate 102 below the SiGe core portions 108' and the Si-rich portions 125 at the bottom of patterned stacks, the top surface of the substrate 102 and the hardmasks 110 at the top of the patterned stacks, remain intact.

Figure 3:
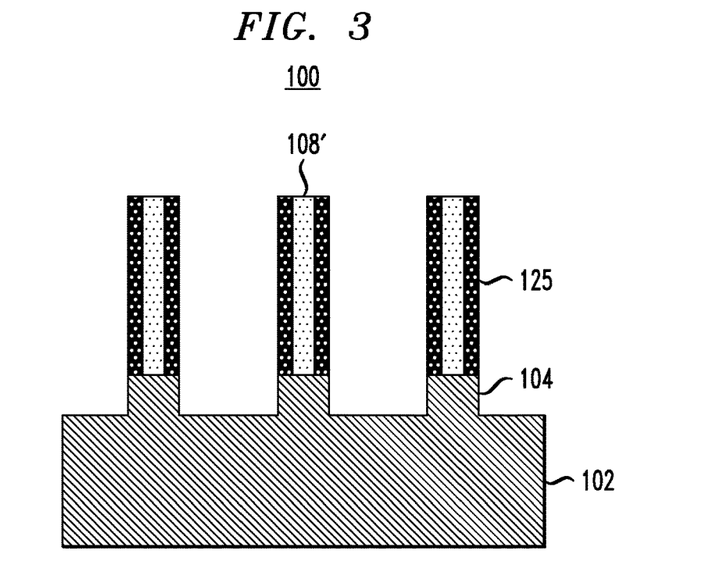
FIG. 3 is a cross-sectional view illustrating oxide and mask removal in a method of manufacturing a semiconductor device, according to an exemplary embodiment of the present invention.

FIG. 3 is a cross-sectional view illustrating oxide and mask removal in a method of manufacturing a semiconductor device, according to an exemplary embodiment of the present invention. Referring to FIG. 3, the unreacted portions of the GeO$_2$ layer 120, and the SiO$_x$ layers 123 are removed using, for example, diluted hydrofluoric acid (DHF). The unreacted portions of the GeO$_2$ layer 120 are removed from the stacked structures including the hardmask layer 110 and the upper pedestal portions 104 of the substrate 102, as well as from the top surface of the substrate 102. The SiO$_x$ layers 123 are removed from the sides of the Si-rich portions 125. As shown in FIG. 3, the hardmasks 110 are removed using, for example, etching with hot phosphorous. The removal of the hardmasks 110 exposes the top surfaces of the SiGe core portions 108'.

Figure 4A:
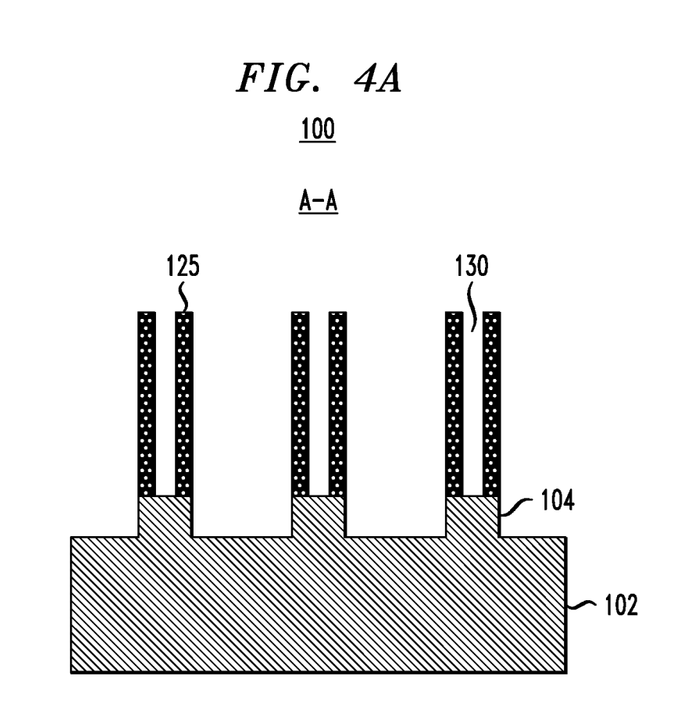
FIG. 4A is a cross-sectional view taken along the line A-A in FIG. 4B and illustrating selective removal of silicon germanium (SiGe) core regions with respect to silicon nanotubes in a method of manufacturing a semiconductor device, according to an exemplary embodiment of the present invention.
Figure 4B:
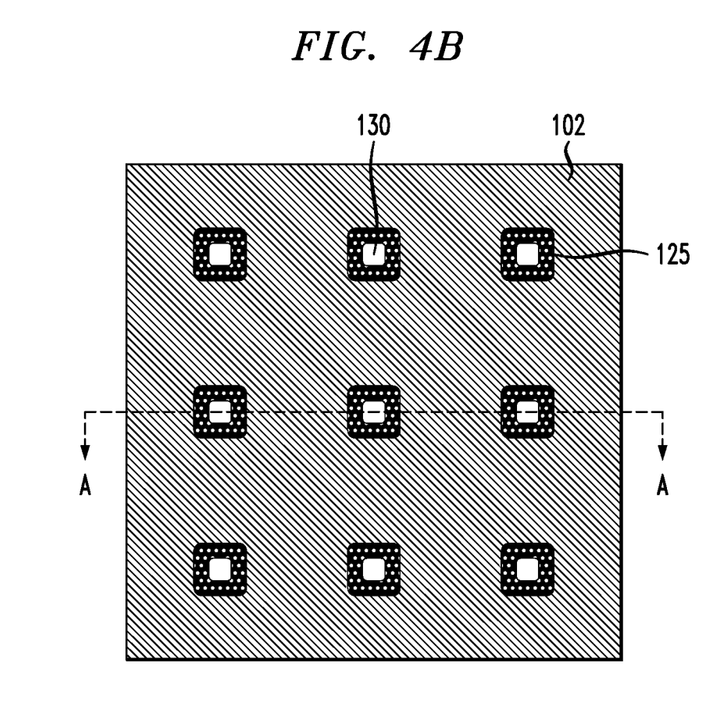
FIG. 4B is a top down view illustrating selective removal of SiGe core regions with respect to silicon nanotubes in a method of manufacturing a semiconductor device, according to an exemplary embodiment of the present invention.

FIG. 4A is a cross-sectional view taken along the line A-A in FIG. 4B, and FIG. 4B is a top down view illustrating selective removal of SiGe core regions with respect to silicon nanotubes in a method of manufacturing a semiconductor device, according to an exemplary embodiment of the present invention. Referring to FIGS. 4A and 4B, the SiGe core regions 108' are selectively removed with respect to the silicon nanotubes 125 to result in densely formed and uniform silicon nanotubes 125 on the upper pedestal portions 104 of the substrate 102. In accordance with an embodiment of the present invention, the SiGe core portions 108' are selectively removed using an etch process including, for example, hydrochloric acid (HCl) gas or hot SC1 (ammonia and hydrogen peroxide solution). According to an embodiment of the present invention, the gap 130 formed as a result of the removal of the SiGe core portions 108' varies with the width of the SiGe portions 108', and can be in the range of, for example, about 4 nm to about 40 nm. As can be seen in the top view in FIG. 4B, an array of cylindrical vertical silicon nanotubes 125 is formed on the substrate 102.

Figure 5:
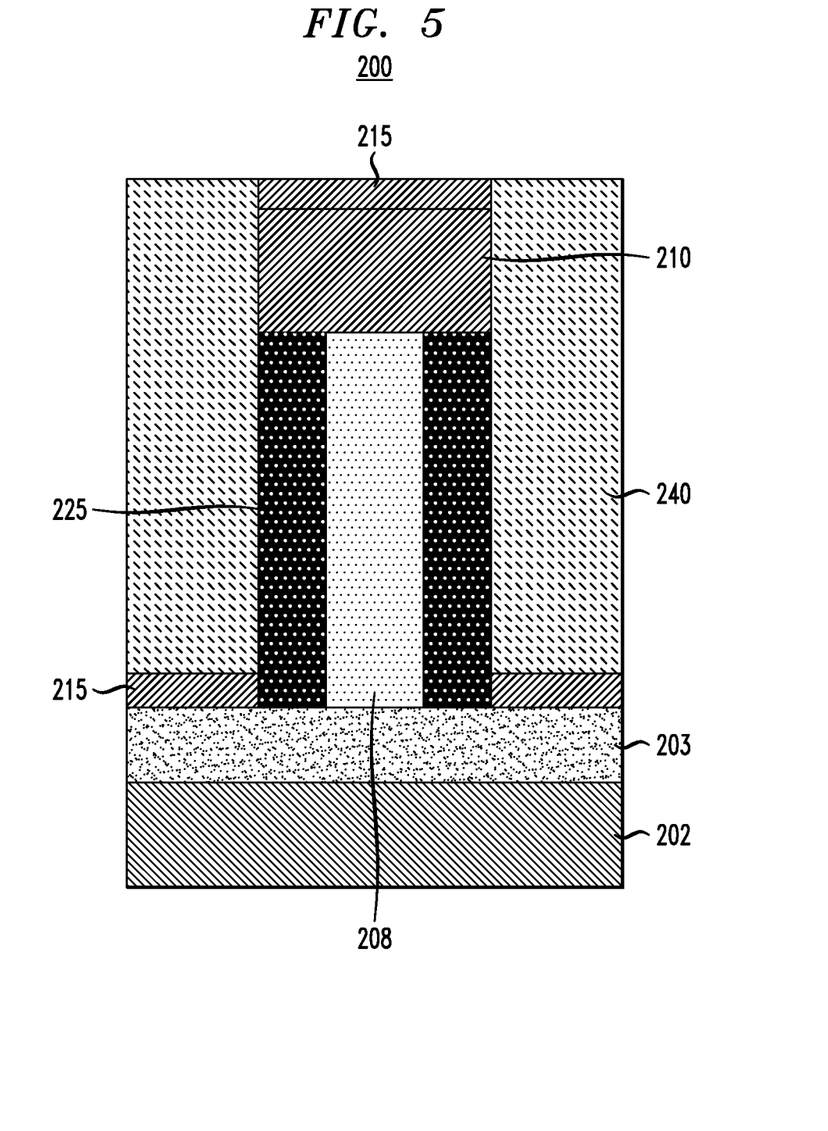
FIG. 5 is a cross-sectional view illustrating a SiGe core region including silicon-rich layers and a mask layer formed on the SiGe core region in a method of manufacturing a semiconductor device, according to an exemplary embodiment of the present invention.

FIG. 5 is a cross-sectional view illustrating a SiGe core region including silicon-rich layers and a mask layer formed on the SiGe core region in a method of manufacturing a semiconductor device, according to an exemplary embodiment of the present invention. Referring to FIG. 5, similar to the device 100 discussed in connection with FIGS. 1-3, 4A and 4B, a device 200 includes a SiGe core portion 208 surrounded by a Si-rich portion 225, and includes a hardmask layer 210 on the SiGe core portion 208 and the Si-rich portion 225. The portions 208, 210 and 225 are formed by the same or similar processes and have the same or similar structure as portions 108', 110 and 125 described in connection with device 100. Device 200 includes a bottom source/drain region 203 formed on a substrate 202 like substrate 102. The bottom source/drain region 203 can be formed by, for example, in-situ doped epitaxy prior to SiGe pillar formation, or formed after SiGe pillar formation using sacrificial spacers on pillar sidewalls. For ease of explanation, one pillar is shown in FIGS. 5-9A. However, the embodiments of the present invention are not necessarily limited thereto, and more than one pillar including a SiGe core portion 208 and a corresponding Si-rich portion is contemplated.

As shown in FIG. 5, dielectric material layers 215 including, for example, SiN, silicon boron nitride (SiBN), silicon-borocarbonitride (SiBCN), silicon oxycarbonitride (SiOCN) or other dielectric, are formed by directional high density plasma (HDP) deposition. The dielectric material layers 215 on the bottom source/drain region 203 adjacent the Si-rich portion 225 are bottom spacers for the resulting structure of the device 200. The dielectric material layer 215 on the hardmask 210 is removed in a subsequent step as described herein below.

A sacrificial dielectric layer 240 is formed on the dielectric layers 215 and on sides of the Si-rich portion 225 and the hardmask 210. Prior to formation of the dielectric layers 215 and the sacrificial dielectric layer 240, the sides of the Si-rich portion 225 and the hardmask 210 can be exposed by the removal of unreacted portions of the GeO$_2$ layer, and the SiO$_x$ layers as discussed in connection with FIG. 3. The sacrificial dielectric layer 240 is formed by one or more deposition techniques, including, but not necessarily limited to, chemical vapor deposition (CVD), plasma enhanced CVD (PECVD), radio-frequency CVD (RFCVD), physical vapor deposition (PVD), ALD, molecular layer deposition (MLD), molecular beam deposition (MBD), pulsed laser deposition (PLD), liquid source misted chemical deposition (LSMCD), sputtering, and/or plating, followed by a planarization process such as, for example chemical mechanical planarization (CMP) down to the dielectric layer 215 on the hardmask 210. The sacrificial dielectric layer 240 includes, for example, SiO$_x$, silicon oxycarbide (SiOC) or some other dielectric.

Figure 6:
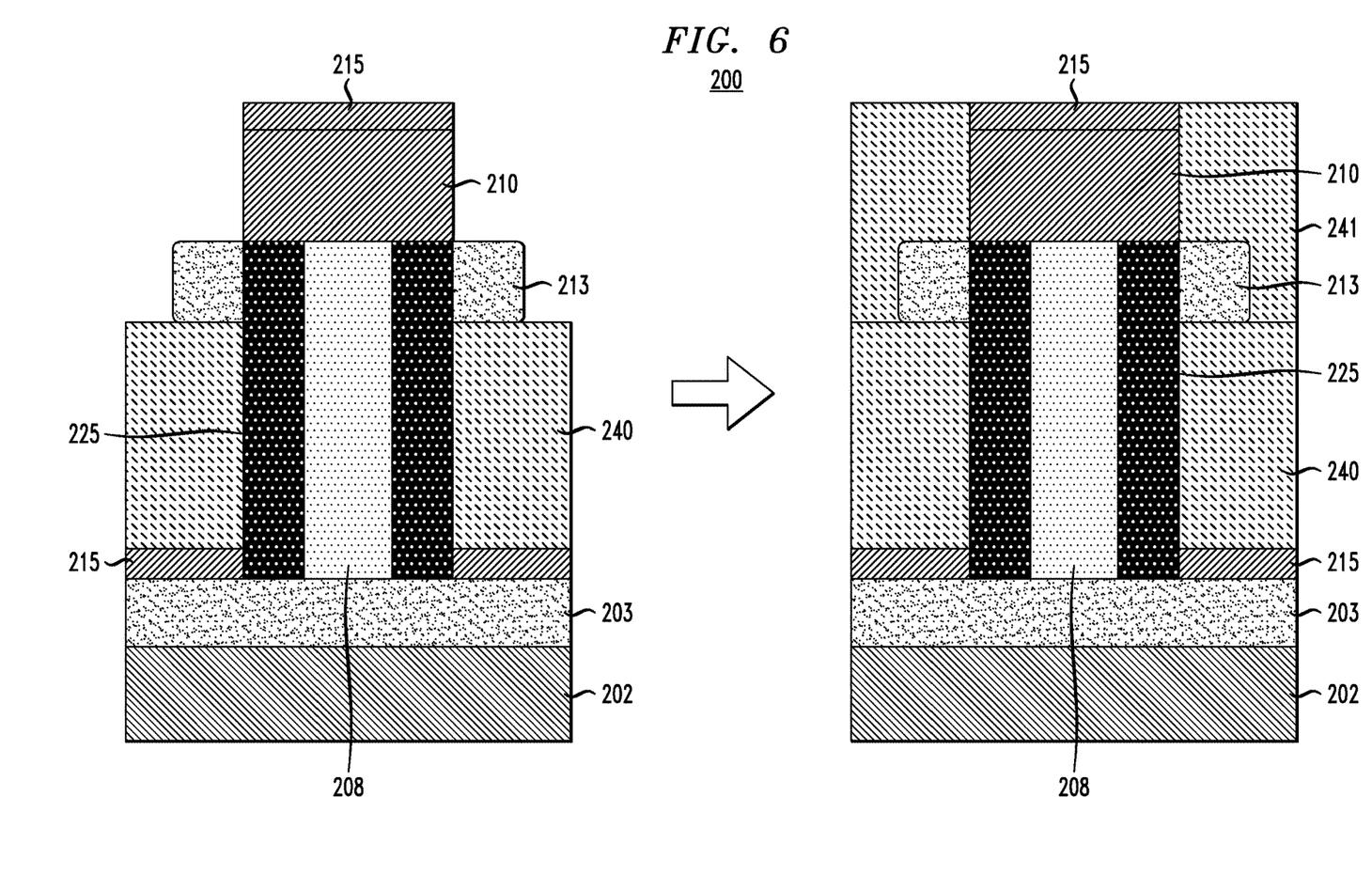
FIG. 6 is a cross-sectional view illustrating sacrificial dielectric layer recessing and formation, and top source/drain region formation in a method of manufacturing a semiconductor device, according to an exemplary embodiment of the present invention.

FIG. 6 is a cross-sectional view illustrating sacrificial dielectric layer recessing and formation, and top source/drain region formation in a method of manufacturing a semiconductor device, according to an exemplary embodiment of the present invention. Referring to FIG. 6, the sacrificial dielectric layer 240 is recessed to a height below upper surfaces of the Si-rich and SiGe core portions 225 and 208. The recessing is performed using, for example, a wet chemistry including, for example, DHF, or a dry chemistry such as, chemical oxide removal (COR) using NH$_3$F gas. Following recessing of the sacrificial dielectric layer 240, top source/drain regions 213 are formed by epitaxial growth from sidewalls of the Si-rich portion 225 (also referred to as a silicon nanotube 225). Following epitaxial growth, similar to the sacrificial dielectric layer 240, another sacrificial dielectric layer 241 is formed on the sacrificial dielectric layer 240, and on and around the top source/drain regions 213, Similar to the sacrificial dielectric layer 240, the sacrificial dielectric layer 241 is formed by one or more deposition techniques, including, but not necessarily limited to, CVD, PECVD, RFCVD, PVD, ALD, MLD, MBD, PLD, LSMCD, sputtering, and/or plating, followed by a planarization process such as, for example CMP down to the dielectric layer 215 on the hardmask 210. The sacrificial dielectric layer 241 includes, for example, SiO$_x$, SiOC or some other dielectric.

Figure 7:
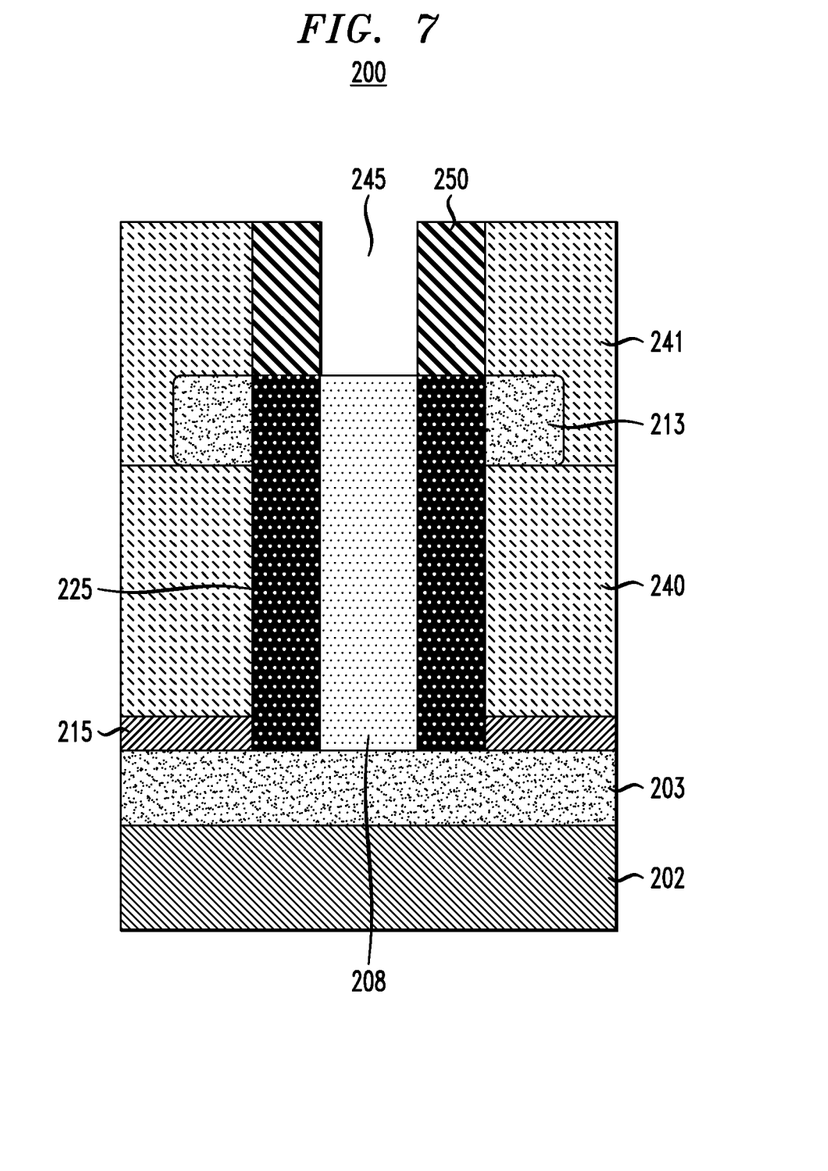
FIG. 7 is a cross-sectional view illustrating mask layer removal and inner spacer formation in a method of manufacturing a semiconductor device, according to an exemplary embodiment of the present invention.

FIG. 7 is a cross-sectional view illustrating mask layer removal and inner spacer formation in a method of manufacturing a semiconductor device, according to an exemplary embodiment of the present invention. Referring to FIG. 7, the hardmask 210 and the dielectric layer 215 on the hardmask 210 (which can be formed from the same or similar material as each other) are removed using, for example, etching with hot phosphorous. The removal of the hardmasks 210 and the dielectric layer 215 on the hardmask 210 exposes the top surfaces of the SiGe core portion 208.

Following removal of the hardmask 210 and the dielectric layer 215 on the hardmask 210, an inner spacer 250 is formed on the silicon nanotube 225 by deposition of a dielectric layer in the space 245 left by the removal of the hardmask and dielectric layer 210 and 215. The deposition of the dielectric layer can be performed using one or more deposition techniques, including, but not necessarily limited to, CVD, PECVD, RFCVD, PVD, ALD, MLD, MBD, PLD, LSMCD, sputtering, and/or plating, followed by a reactive ion etch (RIE) process to remove a middle portion of the dielectric layer over the SiGe core portion 208 and pattern the deposited dielectric layer into the inner spacer 250. In accordance with an embodiment of the present invention, the dielectric layer comprises, for example, a low-k dielectric, such as, but not necessarily limited to, SiN based lower-k dielectric materials like SiBCN or SiOCN, so that the sacrificial dielectric layers 240/241 including, for example, $SiO_x$, can be selectively removed with respect to the inner spacer 250.

Figure 8:
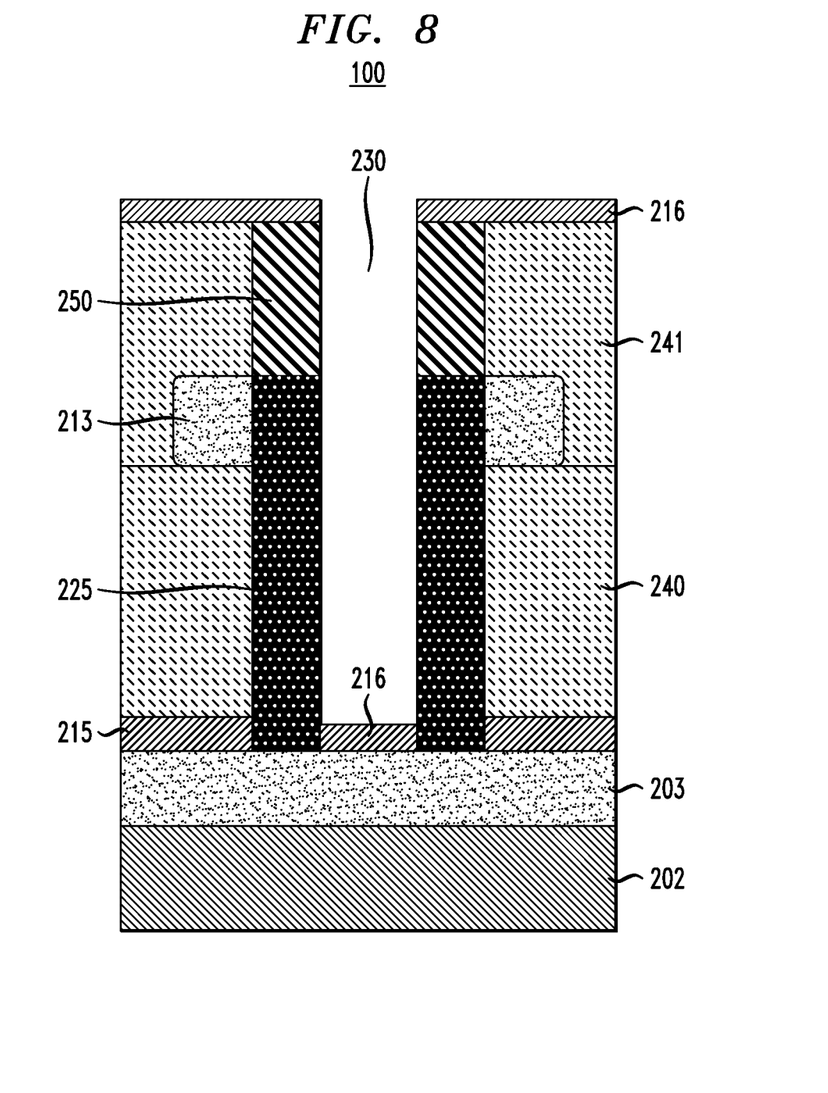
FIG. 8 is a cross-sectional view illustrating selective removal of a SiGe core region with respect to a silicon nanotube structure and bottom spacer formation in a method of manufacturing a semiconductor device, according to an exemplary embodiment of the present invention.

FIG. 8 is a cross-sectional view illustrating selective removal of a SiGe core region with respect to a silicon nanotube structure and bottom spacer formation in a method of manufacturing a semiconductor device, according to an exemplary embodiment of the present invention. Referring to FIG. 8, the SiGe core region 208 is selectively removed with respect to the Si-rich portion 225 (also referred to herein as "silicon nanotube") to result in a silicon nanotube 225 on the bottom source/drain region 203. In accordance with an embodiment of the present invention, the SiGe core portion 208 is selectively removed with respect to the Si-rich and inner spacer portions 225 and 250, and with respect to the sacrificial dielectric layer 241 using an etch process including, for example, HCl gas or hot SC1. According to an embodiment of the present invention, the gap 230 formed as a result of the removal of the SiGe core portion 208 varies with the width of the SiGe portion 208, and can be in the range of, for example, about 4 nm to about 40 nm.

As shown in FIG. 8, dielectric material layers 216 including, for example, SiN, silicon boron nitride (SiBN), silicon-borocarbonitride (SiBCN), silicon oxycarbonitride (SiOCN) or other dielectric, are formed by directional high density plasma (HDP) deposition. The dielectric material layer 216 on the bottom source/drain region 203 in the space where the SiGe core portion was removed forms a bottom spacer for the resulting structure of the device 200. The dielectric material layers 216 on the sacrificial dielectric layer 241 removed in a subsequent step as described herein below.

Figure 9A:
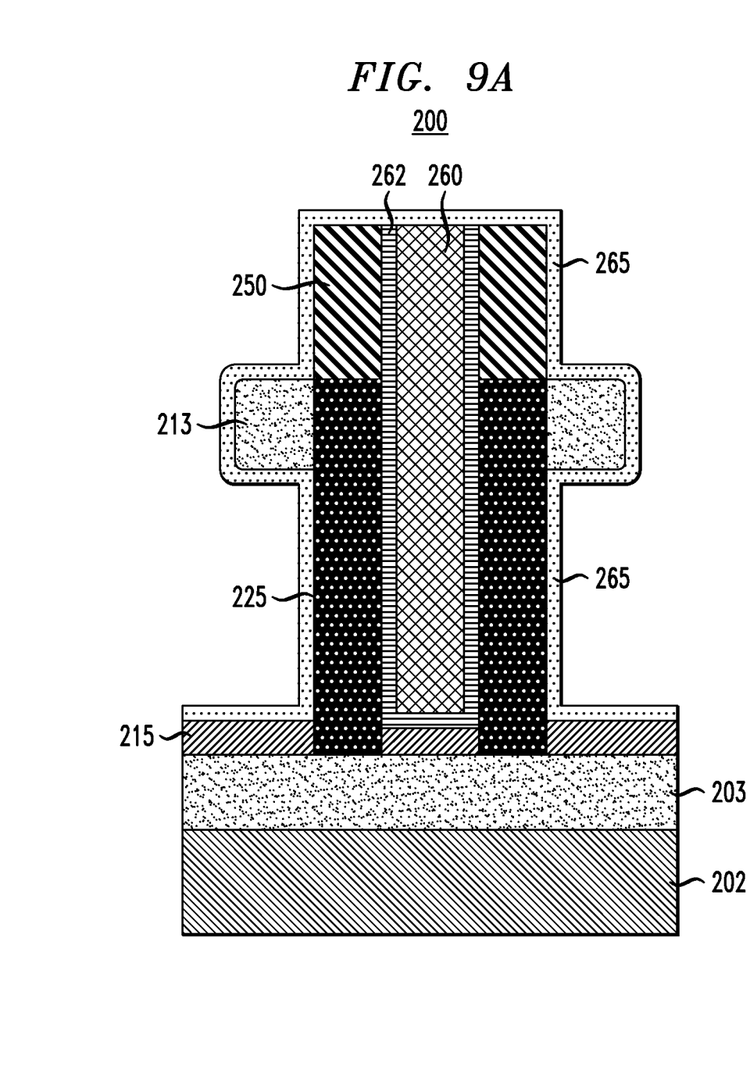
FIG. 9A is a cross-sectional view of a nanotube sensor taken along the line B-B in FIG. 9B and illustrating gate structure and absorption layer formation and sacrificial dielectric layer removal in a method of manufacturing a semiconductor device, according to an exemplary embodiment of the present invention.
Figure 9B:
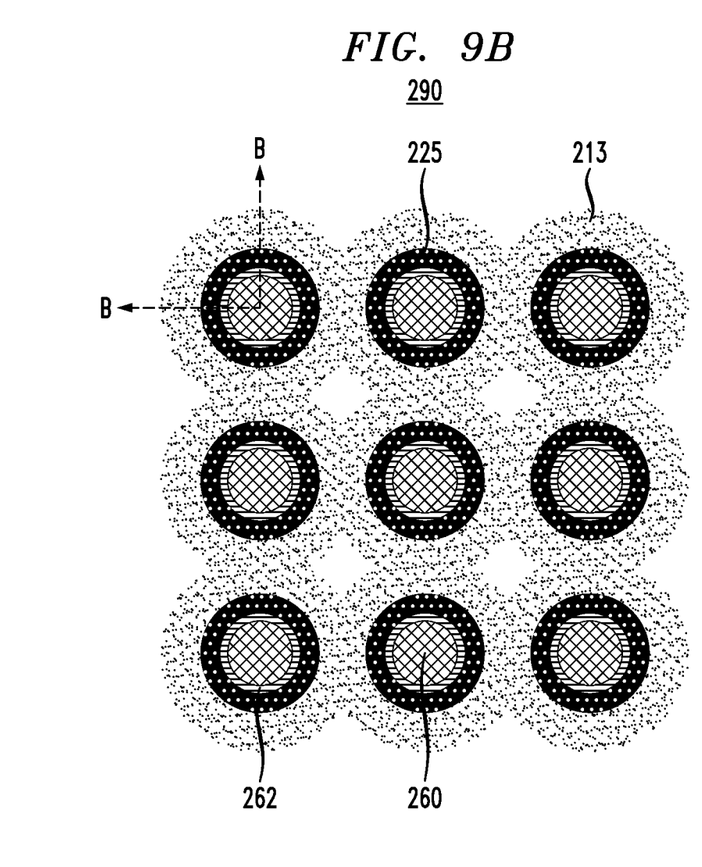
FIG. 9B is a top down view of a nanotube sensor array, according to an exemplary embodiment of the present invention.

FIG. 9A is a cross-sectional view of a nanotube sensor taken along the line B-B in FIG. 9B and illustrating gate structure and absorption layer formation and sacrificial dielectric layer removal in a method of manufacturing a semiconductor device, according to an exemplary embodiment of the present invention. FIG. 9B is a top down view of a nanotube sensor array, according to an exemplary embodiment of the present invention. Referring to FIGS. 9A and 9B, a gate structure include a gate layer 260 and a dielectric layer 262 is formed on the bottom spacer 216 in the space 230. The dielectric layer 262 includes, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layer 260 includes, for example, a work-function metal (WFM) layer, including but not necessarily limited to, for a p-type device, titanium nitride (TiN), tantalum nitride (TaN) or ruthenium (Ru), and for an n-type device, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layer 260 can further include a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structure is deposited on the bottom spacer 216 in the space 230 using, for example, deposition techniques including, but not limited to, CVD, PECVD, RFCVD, PVD, ALD, MLD, MBD, PLD, LSMCD, sputtering, and/or plating. A planarization process, such as, for example, CMP, is performed to remove excess portions of the gate structure on the sacrificial dielectric layer and the inner spacers 250.

Following gate structure formation, the sacrificial dielectric layers 240 and 241 are selectively removed to expose sidewalls of the nanotube 225. The selective removal is performed using, for example, DHF or buffered HF, or selective dry RIE. Then, a dielectric layer 265 including, for example, $SiO_x$ or silicon oxynitride (SiON), or a high-k dielectric, is conformally deposited on the portions left exposed after the selective removal including the bottom spacers 215, sidewalls of the nanotube 225, outer surfaces of the top source/drain regions 213, and on the inner spacers 250 and the gate structure portions 260 and 262. The conformal deposition is performed using, for example, ALD or other conformal deposition process. The dielectric layer 265 functions as an absorption layer for a sensor, such as a biosensor.

FIG. 9B illustrates an array 290 of nanotube sensors like the nanotube sensor device 200 shown in FIG. 9A. More specifically, according to an embodiment of the present invention, each nanotube sensor device 200 of the array 290 is a vertical nanotube transistor sensor with a nanotube 225, top and bottom source/drain regions 203 and 213 and a gate structure 260, 262 surrounded by the nanotube 225.

When a charged species (e.g., DNA) attaches to the outer sidewalls of the silicon nanotube 225 via the absorption layer 265, the charges of the charged species serves as a back gate of the nanotube transistor, changing the threshold voltage (Vt) of the vertical nanotube transistor.

According to an embodiment of the present invention, multiple nanotube transistors can be connected together to serve as one sensor. Multiple nanotubes increase the sensing area in comparison with a single nanotube sensor. As shown in FIG. 9B, the top source/drain epitaxial layers 213 can be epitaxially grown until they are physically merged with adjacent top source/drain epitaxial layers 213 in the array 290, and in electrical contact with each other so that one external contact can be used to electrically contact all vertical nanotube transistors in the array 290. A gate contact (not shown) can be formed by a conductor plate (e.g., before the removal of the sacrificial dielectric layers 240/241).

Figure 10:
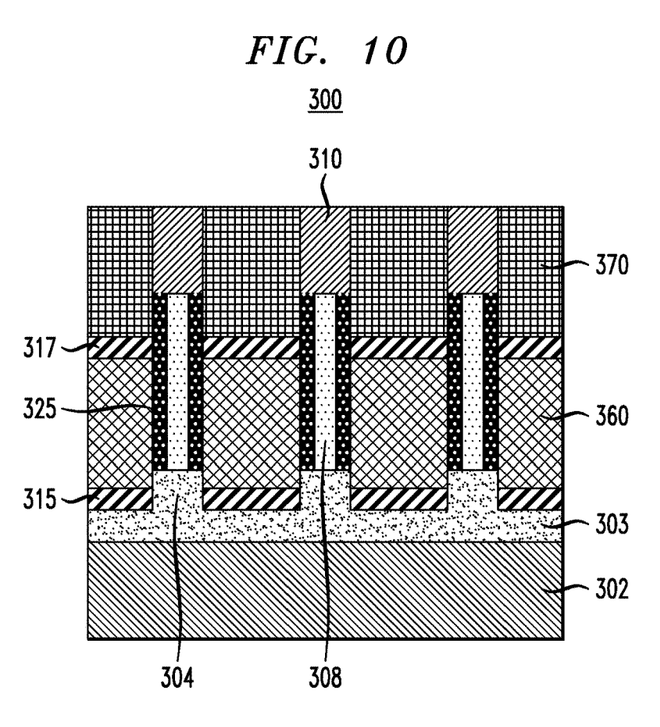
FIG. 10 is a cross-sectional view illustrating spacer, gate and inter-level dielectric (ILD) formation in a method of manufacturing a semiconductor device, according to an exemplary embodiment of the present invention.

FIG. 10 is a cross-sectional view illustrating spacer, gate and inter-level dielectric (ILD) formation in a method of manufacturing a semiconductor device, according to an exemplary embodiment of the present invention. The device 300 in FIG. 10 illustrates pillars having a SiGe core portion 308 and Si-rich portions 325 formed on pedestal portions 304 of a bottom source/drain region 303 on a substrate 202. The structure and fabrication of the pillar portions in FIG. 10 is similar to that of the pillar portions in FIGS. 2 and 3 after the removal of the unreacted portions of the $GeO_2$ layer 120, and the SiO$_x$ layers 123. In the structure shown in FIG. 10, the hardmask layers 310 remain on the SiGe core and Si-rich portions 308, 325, and have not been removed at this stage.

The device 300 in FIG. 10 further includes a bottom source/drain region 303, which can be formed by, for example, in-situ doped epitaxy at the beginning of process, or by bottom source/drain formation after SiGe pillar formation using sacrificial spacers on pillar sidewalls. The pedestal portions 304 include the same or similar structure and material as the pedestal portions 104 described in connection with FIGS. 1-3 and 4A-4B. In addition, the pedestal portions 304 are upper portions of the bottom source/drain region 303 and include one or more dopants. Bottom spacers 315 are formed on exposed horizontal surfaces including the bottom source/drain region 303. Spacer material includes, but is not necessarily limited to, plasma enhanced chemical vapor deposition (PECVD)-type, high aspect ratio process (HARP)-type or HDP-type low-K dielectric layers, including, but not necessarily limited to, SiBN, SiBCN, SiOCN, SiN or SiO$_x$. The bottom spacers 315 is deposited using, for example, directional deposition techniques, including, but not necessarily limited to HDP deposition and gas cluster ion beam (GCIB) deposition. The directional deposition deposits the spacer material preferably on the exposed horizontal surfaces, but not on lateral sidewalls. Spacer material formed on the hardmasks 310 will later be removed during subsequent planarization steps.

A gate structure 360 includes gate layers and dielectric layers the same or similar to the gate and gate dielectric layers 260 and 262.

The gate structures 360 are deposited on the spacers 315 on and around the pillars including the Si-rich portions 325, using, for example, deposition techniques including, but not limited to, CVD, PECVD, RFCVD, PVD, ALD, MLD, MBD, PLD, LSMCD, sputtering, and/or plating. A planarization process, such as, for example, CMP, is performed to remove excess portions of the gate structures 360 and spacer material on the hardmasks 310.

The gate structures 360 are recessed using, for example, an anisotropic etch process, such as RIE, ion beam etching, plasma etching or laser ablation. According to an embodiment, recessing is performed by a wet or dry etching process that is selective with respect to materials of the Si-rich portions 325 and the hardmasks 310.

Top spacers 317 are deposited on the recessed gate structures 360 using the same or similar process for formation of the bottom spacers 315. Top spacers 317 include the same or similar material to that of the bottom spacers 315. An inter-level dielectric (ILD) layer 370 comprising, for example, silicon oxide (SiO$_x$), silicon oxycarbide (SiOC), silicon oxycarbonitride (SiOCN) or some other dielectric is formed on the exposed portions of the structure after formation of the top spacers 317. The ILD layer 370 is deposited using a deposition process, such as, for example, CVD, PECVD, PVD, ALD, MBD, PLD, LSMCD, and/or spin-on coating. The deposited layer is planarized down to the hardmask layers 310 using a planarization process, such as, for example, CMP.

Figure 11:
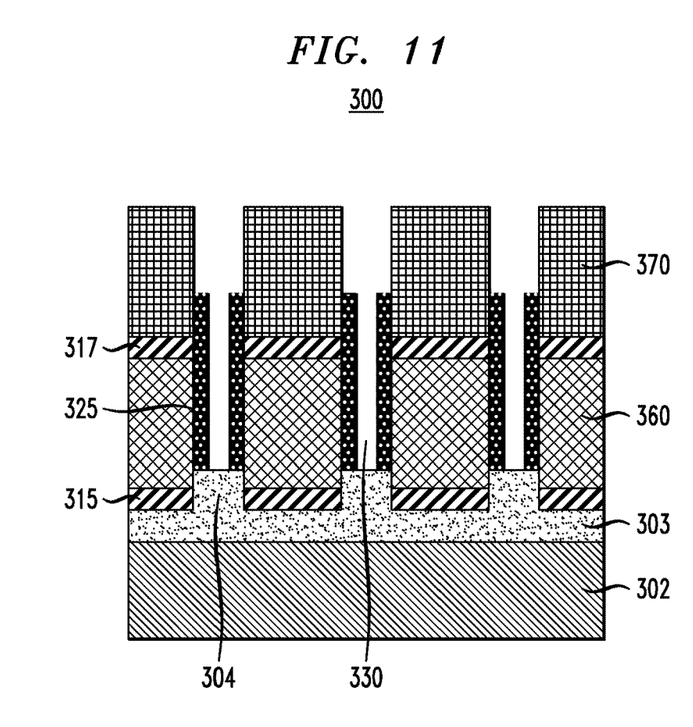
FIG. 11 is a cross-sectional view illustrating selective removal of mask layers and of SiGe core regions with respect to silicon nanotubes in a method of manufacturing a semiconductor device, according to an exemplary embodiment of the present invention.

FIG. 11 is a cross-sectional view illustrating selective removal of mask layers and of SiGe core regions with respect to silicon nanotubes in a method of manufacturing a semiconductor device, according to an exemplary embodiment of the present invention. Referring to FIG. 11, the hardmasks 310 are selectively removed with respect to the ILD layer 370 using, for example, etching with hot phosphorous. The removal of the hardmasks 310 exposes the top surfaces of the SiGe core portions 308.

Following removal of the hardmasks 310, the SiGe core regions 308 are selectively removed with respect to the Si-rich portions 325 (also referred to herein as "silicon nanotubes") to result in densely formed and uniform silicon nanotubes 325 on pedestal portions 304 of the bottom source/drain region 303 on the substrate 302. In accordance with an embodiment of the present invention, the SiGe core portions 308 are selectively removed using an etch process including, for example, HCl gas or hot SC1. According to an embodiment of the present invention, the gap 330 formed as a result of the removal of the SiGe core portions 308 varies with the width of the SiGe portions 308, and can be in the range of, for example, about 4 nm to about 40 nm.

Figure 12:
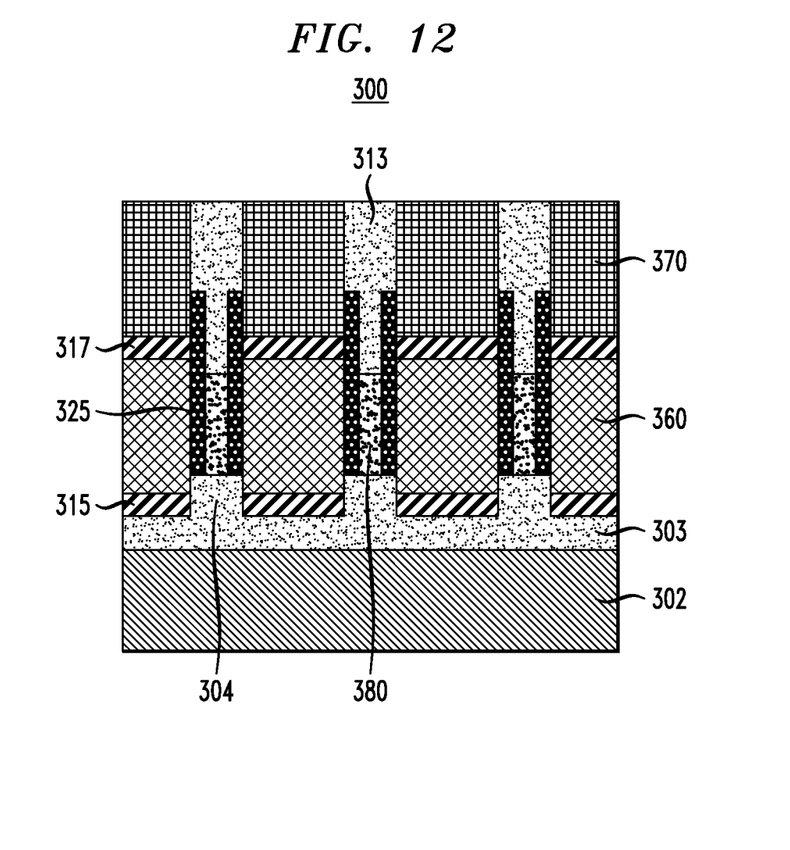
FIG. 12 is a cross-sectional view illustrating dielectric fill layer formation and recessing, and growth of top source/drain regions in a method of manufacturing a semiconductor device, according to an exemplary embodiment of the present invention.

FIG. 12 is a cross-sectional view illustrating dielectric fill layer formation and recessing, and growth of top source/drain regions in a method of manufacturing a semiconductor device, according to an exemplary embodiment of the present invention. Referring to FIG. 12, after removal of the SiGe core portions 308, a dielectric 380 such as, for example, SiN, SiBN, SiBCN, SiOCN or other dielectric is deposited to fill in the gaps 330 between the nanotubes 325. According to an embodiment, the dielectric 380 can be an ALD nitride, or can be deposited by other deposition techniques noted herein, followed by a planarization process, such as, for example, CMP, to remove excess dielectric 380 from the top surface of the ILD layer 370.

The dielectric is recessed to a height below the top of the nanotubes 325 as shown in FIG. 12. The recessing exposes an upper portion of the nanotubes 325 and is selectively performed with respect to a material of the ILD layer 370 using, for example, HCl. Top source/drain regions 313 are epitaxially grown from the exposed upper portions of the silicon nanotubes 325.

In an alternative embodiment, instead of depositing the dielectric 380 in the gaps 330 to be surrounded by the nanotubes 325, an inner gate (not shown) can be formed in place of the dielectric 380 in the gaps 330 as a second gate for Vt tuning/power management.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of pillars on a substrate, each pillar of the plurality of pillars comprising a silicon germanium portion;
   depositing a layer of germanium oxide on the plurality of pillars;
   performing a thermal annealing process to convert outer regions of the silicon germanium portions into a plurality of silicon nanotubes, wherein each silicon nanotube of the plurality of silicon nanotubes surrounds a silicon germanium core portion;
   exposing top surfaces of each of the silicon germanium core portions; and
   selectively removing each of the silicon germanium core portions with respect to the plurality of silicon nanotubes to create a plurality of gaps.

2. The method according to claim 1, wherein the thermal annealing process is performed in an inert gas ambient.

3. The method according to claim 1, wherein the thermal annealing process is performed at a temperature of about 800° C. to about 1100° C.

4. The method according to claim 1, wherein portions of the layer of germanium oxide formed on the silicon germanium portions are converted into silicon oxide by the thermal annealing process.

5. The method according to claim 4, further comprising removing the silicon oxide and unreacted portions of the germanium oxide layer.

6. The method according to claim 5, further comprising forming a sacrificial dielectric layer on side surfaces of each of the plurality of silicon nanotubes.

7. The method according to claim 6, further comprising:
recessing the sacrificial dielectric layer to expose upper portions of the side surfaces of each of the plurality of silicon nanotubes; and
growing source/drain regions from the exposed upper portions of the side surfaces of each of the plurality of silicon nanotubes.

8. The method according to claim 1, wherein:
a plurality of hardmask layers are respectively formed on the plurality of silicon nanotubes and their corresponding silicon germanium core portions: and
the exposing of the top surfaces of each of the silicon germanium core portions comprises removing the plurality of hardmask layers.

9. The method according to claim 1, further comprising growing source/drain regions from upper portions of each of the plurality of silicon nanotubes.

10. The method according to claim 9, wherein the growing is performed until the source/drain regions of each of the plurality of silicon nanotubes are merged with each other.

11. The method according to claim 1, further comprising depositing a gate structure in each of the plurality of gaps.

12. The method according to claim 11, further comprising depositing an absorption layer on each of the plurality of silicon nanotubes.

13. The method according to claim 1, further comprising depositing a dielectric layer in each of the plurality of gaps.

14. The method according to claim 13, further comprising recessing the dielectric layer to expose an upper portion of each of the plurality of silicon nanotubes.

15. The method according to claim 14, further comprising growing source/drain regions from upper portions of each of the plurality of silicon nanotubes.

16. The method according to claim 15, further comprising forming a gate structure around outer surfaces of each of the plurality of silicon nanotubes.

17. A method for manufacturing a semiconductor device, comprising:
forming a plurality of semiconductor layers spaced apart from each other on respective pedestal portions of a substrate, each semiconductor layer of the plurality of semiconductor layers comprising germanium;
depositing a layer of germanium oxide on the plurality of semiconductor layers;
performing a thermal annealing process to convert outer regions of the semiconductor layers into a plurality of nanotubes, wherein each nanotube of the plurality of nanotubes surrounds a semiconductor layer core portion;
exposing top surfaces of each of the semiconductor layer core portions; and
selectively removing each of the semiconductor layer core portions with respect to the plurality of nanotubes to create a plurality of gaps.

* * * * *